(12) United States Patent
Aritome

(10) Patent No.: US 7,763,933 B2
(45) Date of Patent: Jul. 27, 2010

(54) TRANSISTOR CONSTRUCTIONS AND PROCESSING METHODS

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 333 days.

(21) Appl. No.: 11/707,692

(22) Filed: Feb. 15, 2007

(65) Prior Publication Data

US 2008/0197400 A1    Aug. 21, 2008

(51) Int. Cl.
*H01L 29/788* (2006.01)
(52) U.S. Cl. ............... 257/316; 438/593; 257/E27.078
(58) Field of Classification Search ......... 257/316–321, 257/E27.078; 438/257–267
See application file for complete search history.

(56) References Cited

U.S. PATENT DOCUMENTS 5,543,339 A * 8/1996 Roth et al. ............... 438/265
6,602,750 B2 * 8/2003 Kao ........................... 438/260

OTHER PUBLICATIONS

Lee et al., "Effects of Floating-Gate Interference on NAND Flash Memory Cell Operation", IEEE Electron Device Letters, vol. 23, No. 5, May 2002, pp. 264-266.
U.S. Appl. No. 11/471,772, filed Jun. 2006, Aritome.
U.S. Appl. No. 11/617,484, filed Dec. 2006, Tang et al.

* cited by examiner

*Primary Examiner*—Richard A. Booth
(74) *Attorney, Agent, or Firm*—Wells St. John P.S.

(57) ABSTRACT

A transistor construction includes a first floating gate having a first conductive or semiconductive surface and a second floating gate having a second conductive or semiconductive surface. A dielectric region is circumferentially surrounded by the first surface. The region is configured to reduce capacitive coupling between the first and second surfaces. Another transistor construction includes a floating gate having a cavity extending completely through the floating gate from a first surface of the floating gate to an opposing second surface of the floating gate. The floating gate otherwise encloses the cavity, which is filled with at least one dielectric. A method includes closing an upper portion of an opening in insulator material with a gate material during the deposition before filling a lower portion with the gate material. The depositing and closing provide an enclosed cavity within the lower portion of the opening.

26 Claims, 14 Drawing Sheets

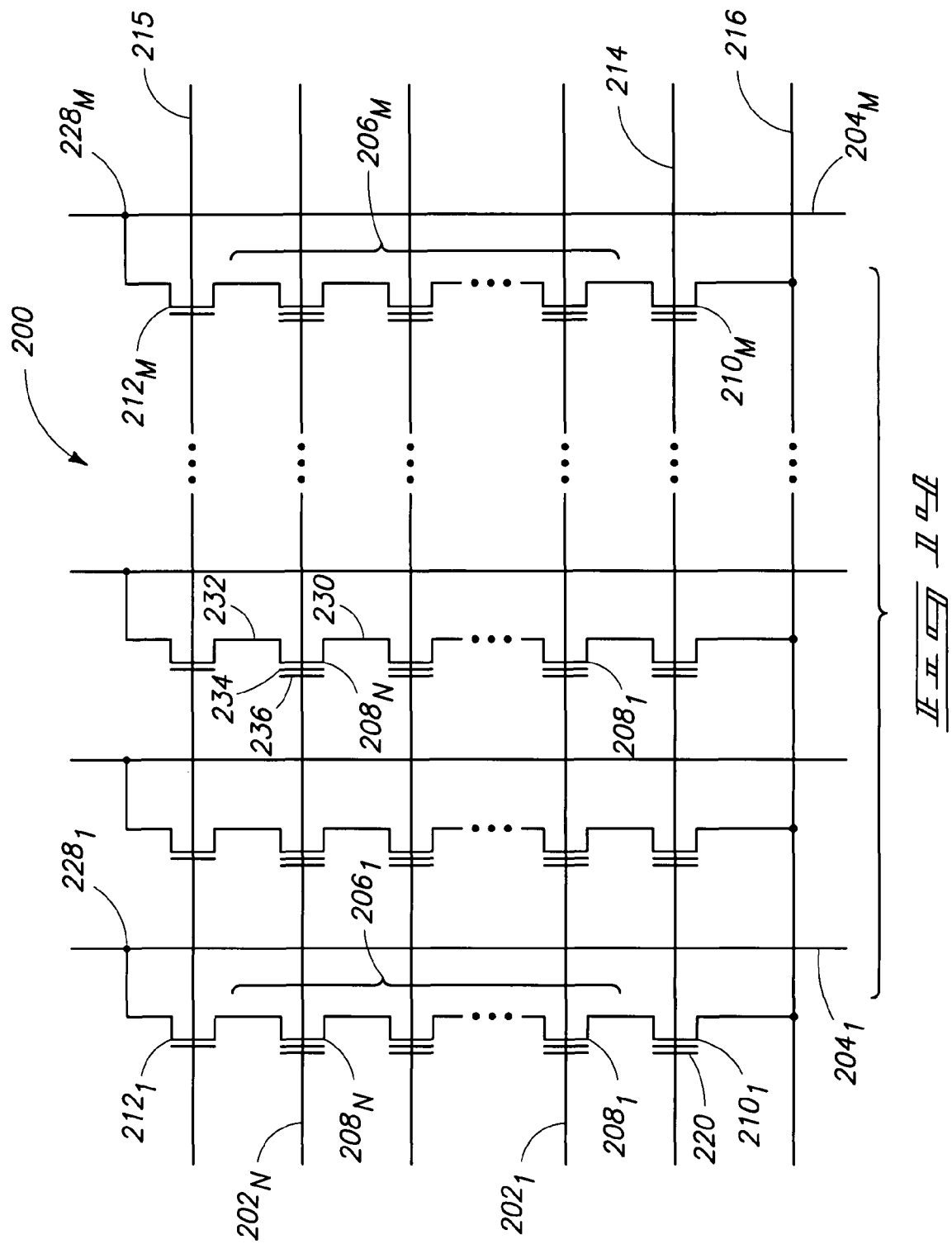

TRANSISTOR CONSTRUCTIONS AND PROCESSING METHODS

TECHNICAL FIELD

Transistor constructions, memory cell constructions, and transistor processing methods.

BACKGROUND

Memory devices provide data storage for electronic systems. One type of non-volatile memory is known as flash memory. A flash memory is a type of electrically-erasable programmable read-only memory (EEPROM) that may be erased and reprogrammed in blocks. Many modern personal computers use a BIOS stored in flash memory, sometimes called a flash BIOS. Wireless electronic devices may use flash memory since it enables a manufacturer to support new communication protocols as they become standardized and to remotely upgrade the device. Other uses for flash memory include USB flash drives, memory cards, digital audio players, digital cameras, GPS/navigation devices, etc.

Often, a flash memory includes a memory array that contains memory cells arranged in row and column fashion. A memory cell may include a floating gate field effect transistor capable of holding a charge, with multiple cells usually grouped into blocks. Cells within a block may be electrically programmed by charging the floating gate. The charge may be removed from the floating gate by a block erase program.

In a single level cell, the cell value may be determined by the presence or absence of the charge on the floating gate. In a multilevel cell, the cell value may be determined by the amount of charge on the floating gate in addition to the absence of charge. That is, the threshold voltage ($V_t$) of a cell decreases with increasing charge. Accordingly, when sensing the presence of charge, a higher range of threshold voltages may be indicative of one charge level while a lower range of threshold voltages may be indicative of a higher charge level. The different charge levels represent different stored values.

NAND is a basic architecture of flash memory, although a NOR architecture may instead be used. A NAND cell unit includes a select gate coupled in series to a serial combination of memory cells (with the serial combination often referred to as a NAND string). With the cells serially combined in a string, understandably, scaling NAND memory cells may bring them in very close proximity. Interference between cells in the form of capacitive coupling between floating gates may produce inaccurate sensing of threshold voltages and, thus, charge levels. Such phenomenon is reported in Lee, et al., "Effects of Floating-Gate Interference on NAND Flash Memory Cell Operation," IEEE Electron Dev. Let., Vol. 23, No. 5, May 2002, pgs. 264-266.

Clearly then, a need exists in the art for improved NAND memory cells and methods of forming NAND memory cells.

BRIEF DESCRIPTION OF THE DRAWINGS

FIG. 14 is a schematic of a NAND memory array.

DETAILED DESCRIPTION OF THE ILLUSTRATED EMBODIMENTS

Figure 1:
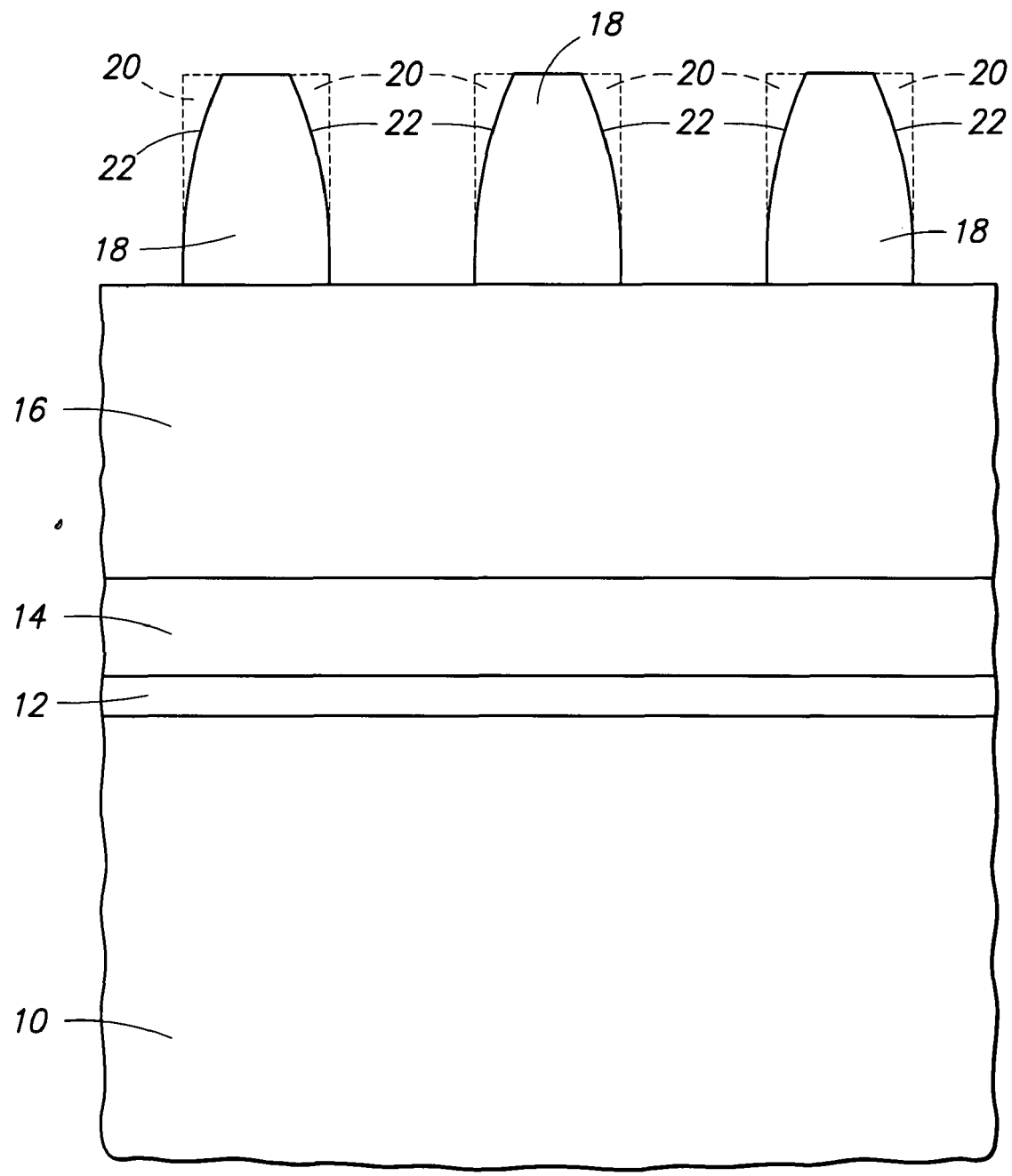
FIGS. 1-9 illustrate cross-sectional views of a portion of a memory array during various stages of fabrication.

Even though the problems addressed by the embodiments described herein arise in the context of scaling NAND memory cells, it should be appreciated that the embodiments may be applicable in other contexts. Examples of other contexts include, but are not limited to, NOR memory cells and, generally, transistors including floating gates.

Primarily, two factors determine the extent of capacitive coupling between floating gates, namely, the distance between two given floating gates and the capacitive area of the floating gates. Capacitive area refers to the conductive (or semiconductive) surface area of a floating gate that is available to participate in capacitive coupling with another floating gate. Capacitive area might be described as the surface area of a floating gate "seen" from the perspective of another floating gate. Capacitive area corresponds with known surface area calculations used to determine capacitance of conventional capacitors.

Generally, a desire exists to reduce distance between floating gates in the process of scaling flash memory cells. As a result, decreasing capacitive coupling by increasing the distance between floating gates may not be practical. Various attempts were made to reduce capacitive coupling by altering the geometry of floating gate surfaces. For example, Lee, et al. reports thinning a floating gate to reduce capacitive coupling, however, the thinning detrimentally reduces the coupling ratio of the floating gate and requires higher programming voltages. Lee, et al. describes the coupling ratio as the control gate-to-floating gate capacitance divided by total capacitance of the floating gate. Thinning the floating gate reduces the control gate-to-floating gate capacitance as well as the total capacitance and decreases the coupling ratio.

In contrast, a transistor construction according to an embodiment of the present specification includes a first floating gate having a first conductive or semiconductive surface and a second floating gate having a second conductive or semiconductive surface. A dielectric region is circumferentially surrounded by the first surface. The region is configured to reduce capacitive coupling between the first and second surfaces compared to capacitive coupling with an otherwise identical first floating gate lacking the region.

By way of example, only the first floating gate might include a dielectric region, and not the second floating gate. Such a configuration may somewhat reduce capacitive coupling even though the second floating gate maintains a conventional surface. Granted, reducing the capacitive area of both the first and second floating gate may further reduce capacitive coupling. Consequently, the transistor construction may further include another dielectric region circumferentially surrounded by the second surface. The other region may be configured to reduce the capacitive coupling compared to capacitive coupling with an otherwise identical second floating gate lacking the other region.

The dielectric region may include silicon oxide, silicon nitride, a gas, or combinations thereof. It is well known that a vacuum between capacitor plates may function as a dielectric. Air, as well as other gas compositions, may also function as a dielectric. Normally, the gaseous atmosphere within which the first and second floating gate may be manufactured may be properly characterized as a dielectric even when enclosed as a void within the floating gate. The dielectric region may reside in a cavity extending into the first floating gate from the first surface. The cavity may extend completely through the first floating gate from the first surface to an opposing surface of the first floating gate. Instead, the cavity may extend only partly through a thickness of the first floating gate between the first surface and an opposing surface of the first floating gate.

The transistor construction may further include a bit line operationally associated with both the first floating gate and the second floating gate. The capacitive coupling may be reduced in a direction along the bit line. The transistor construction may include an active area formed in a semiconductor material, a gate dielectric over the active area, the first floating gate over the gate dielectric, an intergate dielectric over the first floating gate, and a control gate over the intergate dielectric. The floating gates may be included in respective flash memory cells. Specifically, the floating gates may be included in respective NAND transistors of the flash memory cells. As indicated, other memory architectures are conceivable.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A transistor construction according to another embodiment may include a floating gate having a cavity extending completely through the floating gate from a first surface of the floating gate to an opposing second surface of the floating gate. The floating gate otherwise encloses the cavity, which is filled with at least one dielectric.

By way of example, the surface from which the cavity extends may include a conductive surface and the transistor construction may further include another floating gate having third surface comprising a conductive surface. The cavity and the dielectric may be configured to reduce capacitive coupling between the first and third surfaces. The transistor construction may include a bit line associated with both the floating gate and the other floating gate. The capacitive coupling may be reduced in a direction along the bit line between the first and third surfaces. Selections for the dielectric and other components of the transistor construction may be as described for other embodiments herein.

In a further embodiment, a NAND flash memory construction has a first NAND transistor including a first floating gate having a first conductive or semiconductive surface and a second NAND transistor including a second floating gate having a second conductive or semiconductive surface. The first surface is adjacent to the second surface. A first dielectric is recessed into the first floating gate from a central region of the first surface and a second dielectric is recessed into the second floating gate from a central region of the second surface. The first dielectric and the second dielectric are configured to reduce capacitive coupling between the first and second surfaces compared to capacitive coupling between otherwise identical first and second floating gates lacking the first and second dielectrics.

By way of example, the first dielectric may extend completely through the first floating gate from the first surface to an opposing surface of the first floating gate, but the first floating gate otherwise enclosing the first dielectric. The second floating gate and second dielectric may be structured likewise. As an alternative, the first dielectric may extend only partly through a thickness of the first floating gate between the first surface and an opposing surface of the first floating gate. The second floating gate and second dielectric may be structured likewise.

Figure 6:
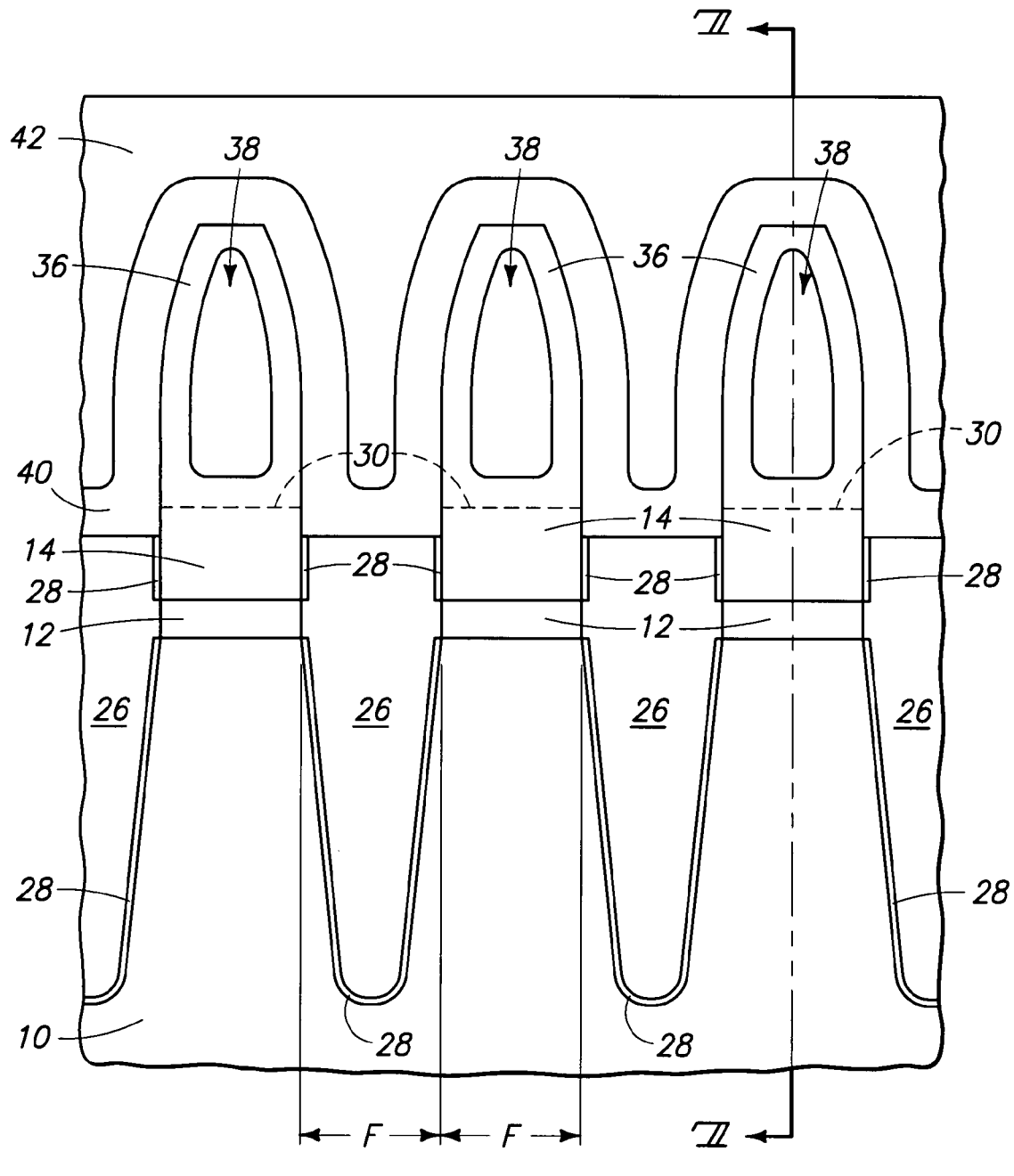
Figure 7:
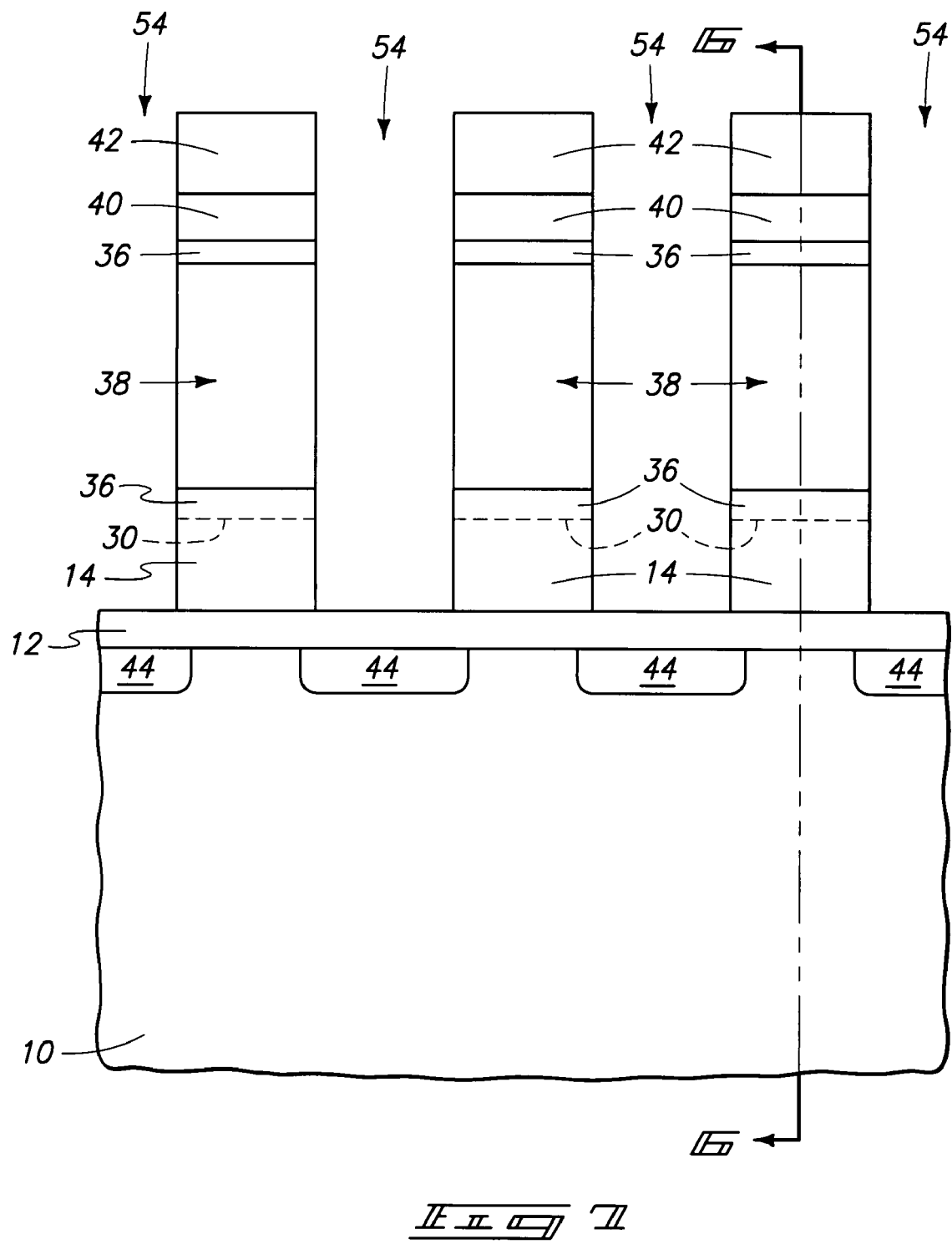

FIGS. 6 and 7 illustrate structural features corresponding to some of the constructions described herein. FIG. 6 shows a cross-sectional view of the transistor construction in FIG. 7 taken along lines 6-6 and FIG. 7 shows a cross-sectional view of the transistor construction shown in FIG. 6 taken along lines 7-7. As will be appreciated from the discussion below, FIG. 6 represents a view of a cross-section taken along the control gate or word line direction while FIG. 7 represents a view of a cross-section taken along the active area or bit line direction.

Specifically, FIGS. 6 and 7 show a semiconductor material 10 with an active area formed therein including source/drain regions 44. A gate dielectric material 12 is over the active area and a floating gate is over gate dielectric material 12. The floating gate includes a supplemental gate material 14 and a gate material 36 on and in contact with supplemental gate material 14. An interface 30 between the two materials delineates the extent of each material. The floating gate is operationally associated with a pair of the source/drain regions 44. Notably, the floating gate has a cavity 38 extending completely through the floating gate from a surface of the floating gate to an opposing surface of the floating gate. Otherwise, the floating gate encloses cavity 38.

An intergate dielectric material 40 is over the floating gate and a control gate material 42 is over intergate dielectric material 40. Filling cavity 38 with at least one dielectric, for example, silicon oxide, silicon nitride, a gas, or combinations thereof, may reduce the capacitive area of the floating gates engaged in capacitive coupling between floating gates along the direction shown in FIG. 7. If cavity 38 were not present and the floating gate instead included more gate material 36, then capacitive area between floating gates along the direction shown in FIG. 7 would be larger. Correspondingly, capacitive coupling would increase.

Notably, the capacitive area between floating gates along the direction shown in FIG. 6 is unchanged by the presence of cavity 38. The floating gates in FIG. 6 "see" the same capacitive area on the surface of the other floating gates regardless of whether cavity 38 is present. In the case of FIG. 6, portions of conductive control gate material 42 exist between floating gates. Accordingly, capacitive coupling between floating gates may be of less concern along the word line direction due to a potential shielding effect of the conductive material. Also, in a transistor including the structures of FIGS. 6 and 7, cavity 38 does not affect the control gate-to-floating gate capacitance even though cavity 38 reduces the floating gate-to-floating gate portion of the total capacitance of the floating gate. As a result, the coupling ratio, mentioned above as described in Lee, et al., does not decrease and may increase.

Understandably, a variety of methods may be useful in forming the transistor constructions and memory cells described herein. In one embodiment, a transistor processing method includes forming an opening in an insulator material and depositing a conformal gate material within the opening. The opening has an upper portion that is narrowed with respect to an elevationally lower portion of the opening such that the method includes closing the narrowed upper portion with the gate material during the deposition before filling the lower portion with the gate material. The depositing and closing provide an enclosed cavity within the lower portion of the opening. The method includes forming a floating gate of a transistor using a section of the gate material including the cavity. The cavity extends at least partly through the floating gate.

By way of example, forming the opening may include exposing a supplemental gate material over a gate dielectric and depositing the gate material may include depositing the gate material on and in contact with the supplemental gate material. Forming the opening in the insulator material to provide a narrowed upper portion may be accomplished by methods known to those of ordinary skill. However, forming the opening may instead include forming a core having opposing, inwardly inclined walls, forming the insulator material over the inclined walls, and removing the core from the insulator material over the inclined walls. The removal may reveal the opening having the narrowed upper portion.

Forming such a core having opposing, inwardly inclined walls may similarly be accomplished by a variety of methods known to those of ordinary skill. However, forming the core may instead include forming a core material, forming a resist mask pattern over the core material and using the resist pattern as a mask. The resist pattern may have opposing, inwardly inclined walls such that etching the core material and transferring the resist pattern to the core material provides the core with the opposing, inwardly inclined walls.

FIGS. 1-7 show one embodiment of a transistor processing method. Fabricating the structure shown in FIG. 1 may include forming gate dielectric material 12 over semiconductor material 10, forming supplemental gate material 14 over gate dielectric material 12 and forming a core material 16 over supplemental gate material 14. Next, a resist may be formed over core material 16 and patterned to produce a resist mask pattern 18 suitable for use in subsequent etching.

Gate dielectric material 12 may be referred to as a tunnel oxide and may include silicon dioxide, silicon oxynitride, or other compositions known to those of ordinary skill. Supplemental gate material 14 may include polysilicon as well as other semiconductor and/or conductor materials suitable for a floating gate. Core material 16 may include silicon nitride or perhaps other materials that may be selectively removed relative to surrounding materials as discussed below.

Resist mask pattern 18 shows trimmed portions 20 removed as a consequence of resist exposure and/or development. This occurrence during exposure and/or development of resists produces rounded corners at top edges of the resist or slanted walls at the top edges. Accordingly, resist patterns often have opposing, inwardly inclined walls at top edges of the resist. Those of ordinary skill normally account for such undesired result by merely providing a resist thickness of such an extent that, during etching and wearing down of a resist, trimmed portions 20 are not transferred to underlying material being etched. Instead, a desire generally exists for structures resulting from etching to provide straight, vertical walls instead of inclined walls 22 shown in FIG. 1. Accordingly, it is unique that embodiments herein beneficially utilize inclined walls 22.

Figure 2:
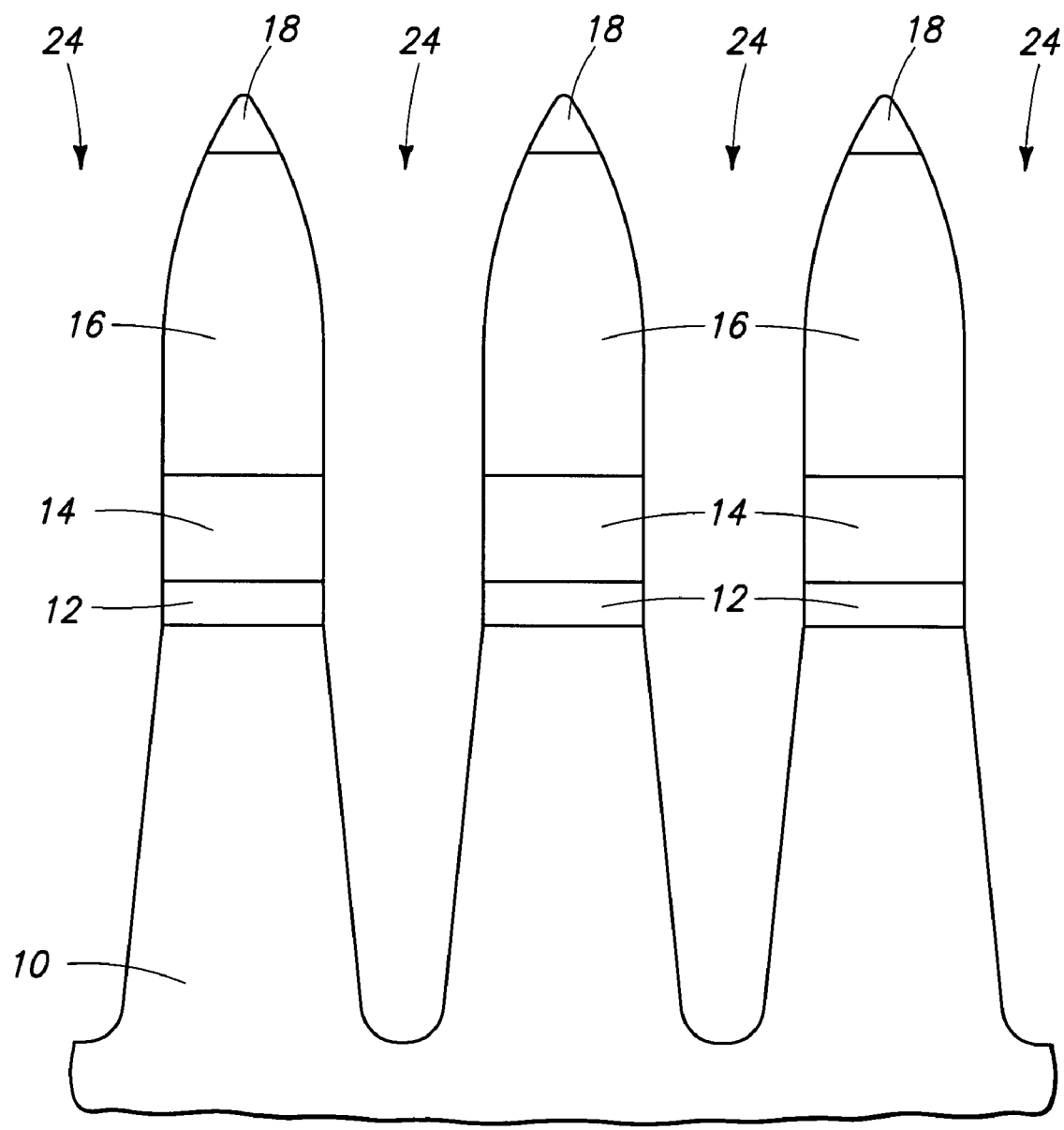

FIG. 2 shows resist mask pattern 18 worn down as a result of etching a trench 24 through core material 16, supplemental gate material 14, and gate dielectric material 12 and into semiconductor material 10. Etching trench 24 may provide an opening in semiconductor material 10 for shallow trench isolation (STI) along with defining a width of supplemental gate material 14 and gate dielectric material 12. Transfer of resist mask pattern 18 to core material 16, including opposing, inwardly inclined walls, is apparent in FIG. 2. Normally, transfer of inclined walls 22 may be avoided by providing resist mask pattern 18 with an increased thickness compared to that shown in FIG. 1 such that it does not wear down to the extent shown in FIG. 2. However, in the present embodiment, an intent exists to transfer inclined walls 22 to core material 16.

Figure 3:
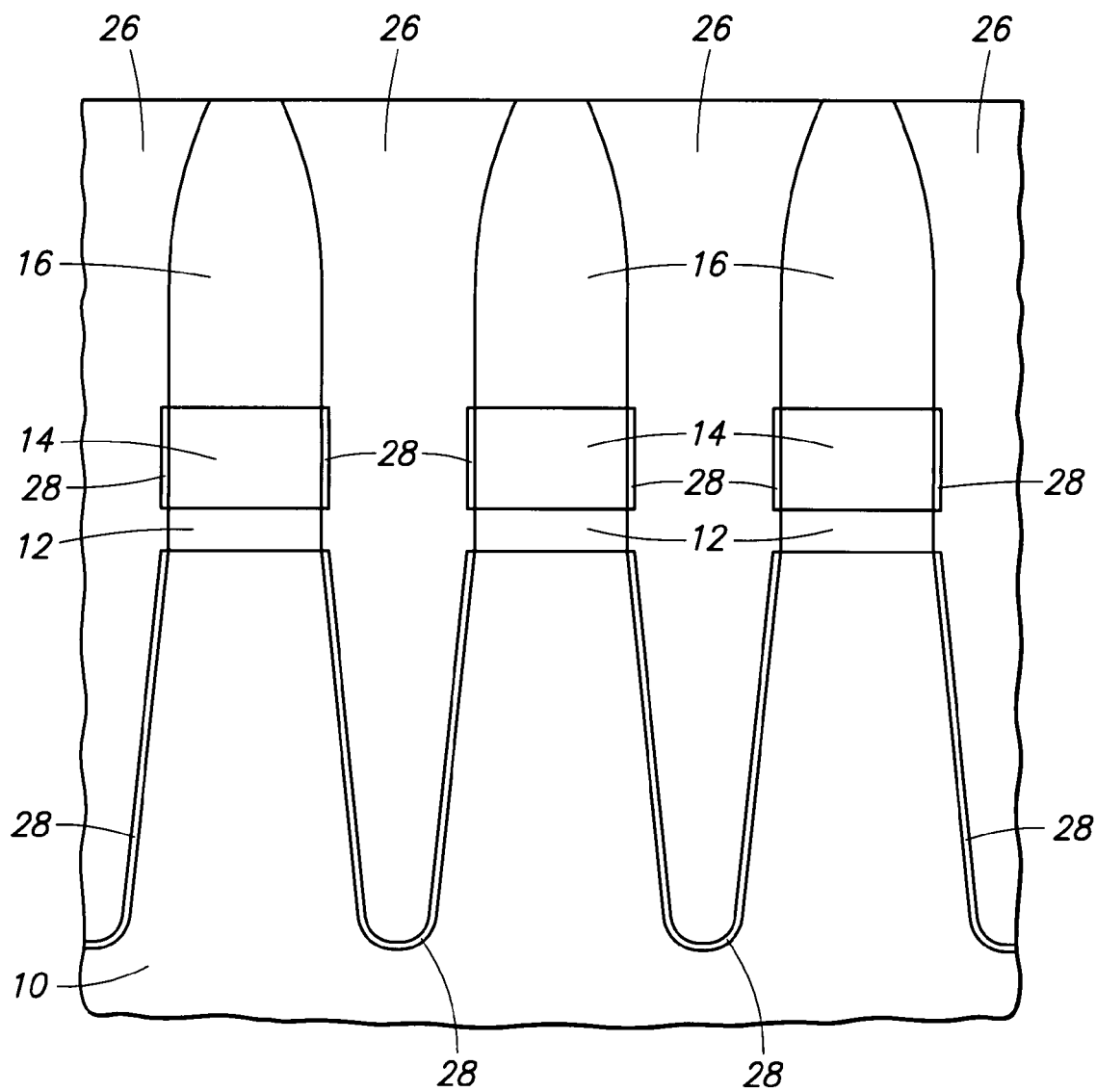

Formation of STI often includes oxidation of silicon-comprising surfaces followed by depositing STI fill material. In the circumstance where semiconductor material 10 and supplemental gate material 14 include silicon, an insulator 28 may be formed over such surfaces as shown in FIG. 3 by a standard STI oxidation process. Alternative processes may be used as taught by those of ordinary skill for different materials. An insulator material 26 may be deposited, filling trenches 24 shown in FIG. 2. One example of a suitable deposition process includes chemical vapor deposition of a silicon oxide material using a plasma with a density of at least $10^{10}$ ions/cm$^3$. Normally, such a deposition is referred to as a high density plasma (HDP) STI fill process.

Excess fill material may be removed, for example, by chemical-mechanical polishing (CMP) to produce the FIG. 3 structure and expose core material 16. CMP may stop on silicon nitride of core material 16 due to a selectivity ratio of 1:20 in favor of removing HDP STI fill. The selectivity ratio may be tuned on a number of known factors to accommodate other materials.

Figure 4:
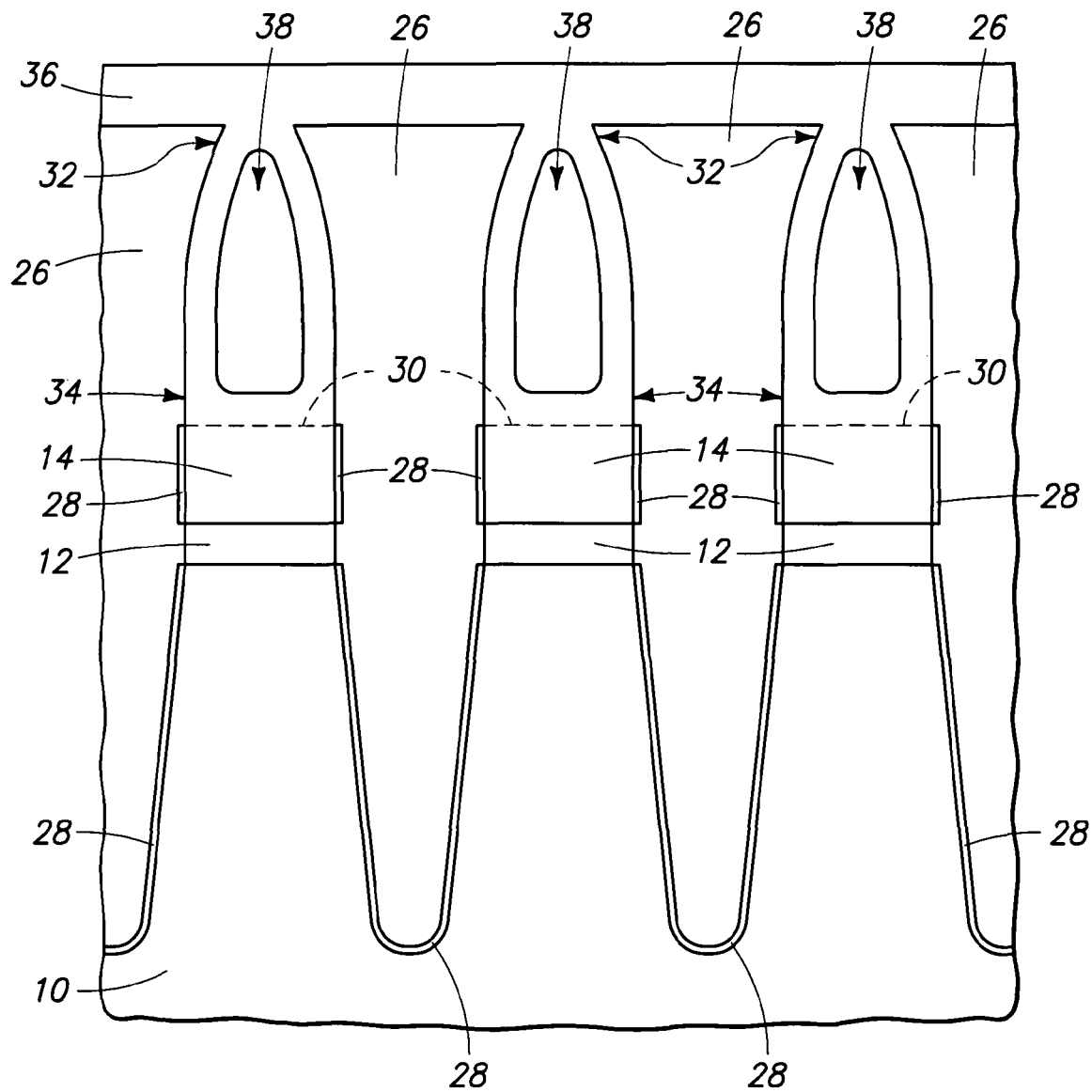

With core material 16 exposed, it is susceptible to selective removal, for example, by wet etching. Hot phosphoric acid ($H_3PO_4$) etching as conventionally performed may be used to selectively remove silicon nitride of core material 16 instead of silicon oxide of insulator material 26. Perhaps for varying compositions of silicon nitride and silicon oxide. Other selective etching techniques are conceivable. Removing core material 16 from insulator material 26 over inclined walls of core material 16 reveals an opening having an upper portion 32 that is narrowed with respect to an elevationally lower portion 34 of the opening, such as shown in FIG. 4. FIG. 4 displays such opening after depositing a conformal gate material 36 within the opening. Gate material 36 closes the narrowed upper portion of the opening during the deposition before filling the lower portion with gate material 36, providing an enclosed cavity 38 within the lower portion of the opening.

Gate material 36 and supplemental gate material 14 may be identical or different, with interface 30 delineating the extent of each material. Formation of supplemental gate material 14 in advance of and separate from formation of gate material 36 allows protection of gate dielectric material 12 during removal of core material 16 to produce the opening with narrowed upper portion 32. Accordingly, the thickness of supplemental gate material 14 may be selected largely as a consideration of the thickness appropriate for protecting gate dielectric material 12. The shape and thickness of gate dielectric material 12 represents one important consideration in ensuring transistor reliability.

Those of ordinary skill will immediately appreciate that cavity 38 or a similar "keyhole" in gate material 36 represents a problem normally avoided in deposition methods. Extensive discussion exists in the art pertaining to avoidance of "keyholes" by keeping the walls of openings vertical and straight (or even outwardly inclined) and/or by controlling deposition conditions. Accordingly, it is unique that embodiments herein beneficially utilize cavity 38 to reduce capacitive coupling.

Figure 5:
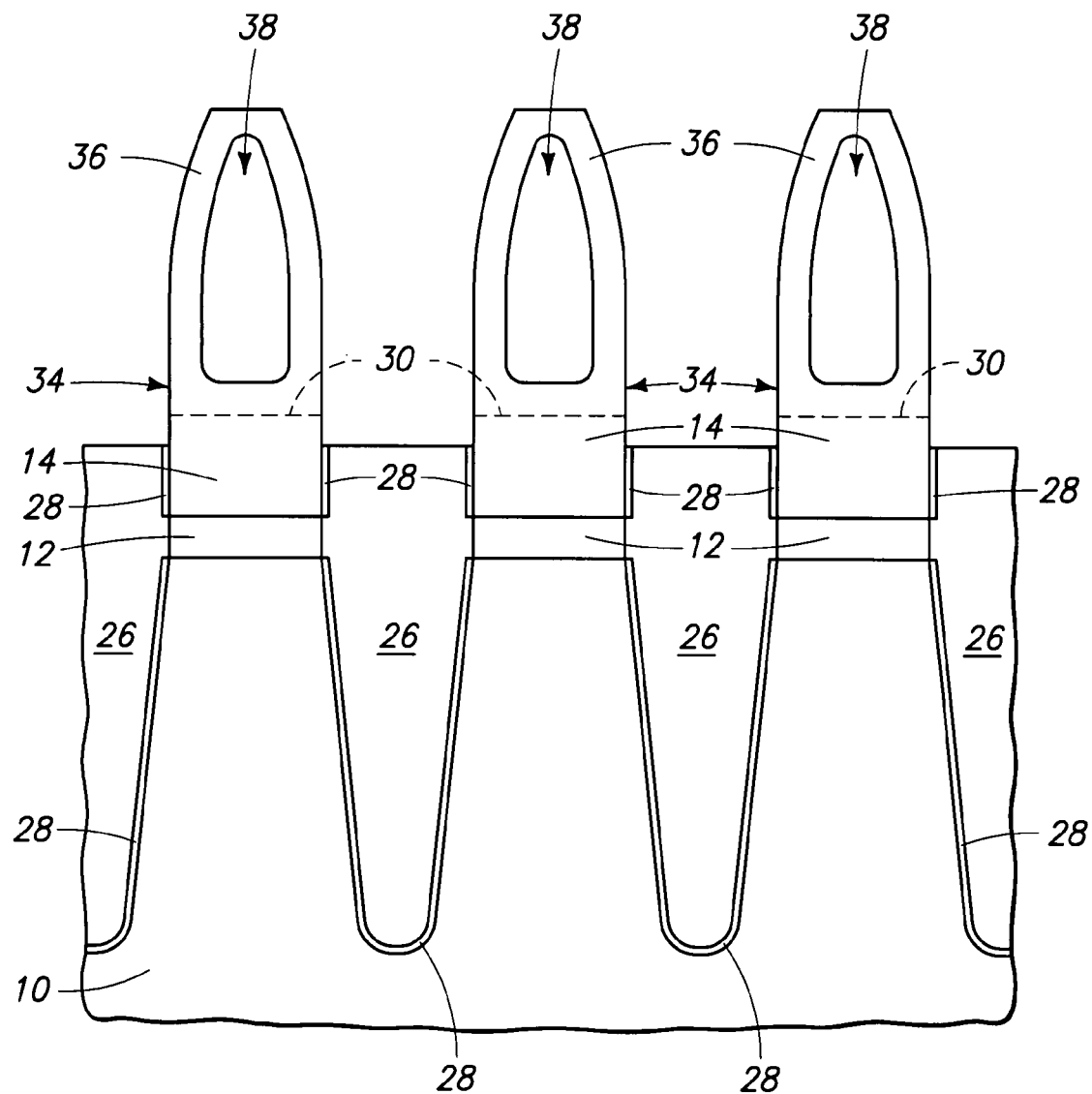

FIG. 5 shows the FIG. 4 structure after removing excess gate material 36 sufficiently to expose insulator material 26 and allowing an etch back of insulator material 26 and insulator 28 to the extent shown in FIG. 5. Gate material 36 removal may be performed by CMP and may stop prior to opening cavity 38.

FIGS. 6 and 7 show the structure of FIG. 5 after forming an intergate dielectric material 40 over the floating gate and forming a control gate material 42 over intergate dielectric material 40, followed by gate patterning. Intergate dielectric material 40 may be a silicon oxide/silicon nitride/silicon oxide (ONO) composite dielectric material. Conventional high K factor (also known as dielectric constant or κ) dielectric material having a K of greater than 7 may be used in place of ONO. Gate patterning etches spaces 54 shown in FIG. 7 through control gate material 42, intergate dielectric material 40, gate material 36, and supplemental gate material 14 at least to the extent shown in FIG. 7 and defines the length of the floating gates. Gate patterning also separates control gate material 42 into word lines.

A variety of options exist following the stage of fabrication shown in FIGS. 6 and 7. Subsequent processing may involve formation of dielectric material in spaces 54, formation of bit line contacts to the active area and patterning of bit lines over control gate material 42. It may be appreciated from FIGS. 6 and 7 that etching spaces 54 exposes cavities 38 in gate material 36. As a result, cavity 38 may be susceptible to partial or complete filling with subsequently formed solid dielectric material in spaces 54.

The extent of cavity 38 filling may depend upon properties of the specific solid dielectric material deposited and the type of deposition. However, expected reductions in capacitive coupling may still be realized regardless of whether cavity 38 is completely filled, partially filled, or not filled with solid dielectric material. To the extent that cavity 38 becomes partially or completely filled with semiconductor or conductor material during subsequent processing, the extent of reduction in capacitive coupling may be lessened.

Figure 12:
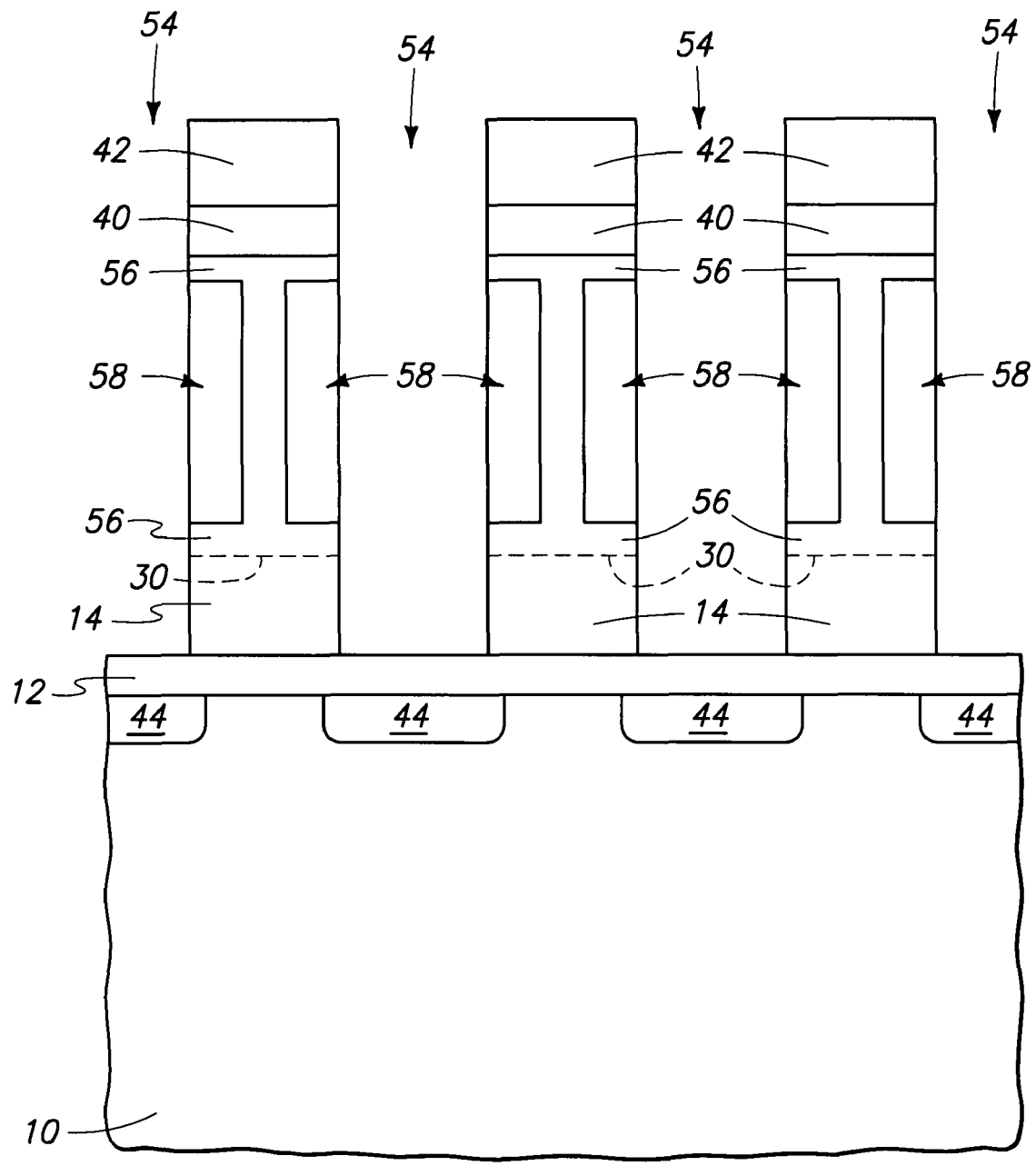
FIG. 12 illustrates a cross-sectional view of a portion of a memory array with an alternative structure in comparison to that shown in FIG. 7.

As shown in FIG. 12, with an alternative structure in comparison to that shown in FIG. 7, a cavity 58 might not extend completely through a gate material 56. Cavity 58 may reduce capacitive coupling essentially by increasing the distance between adjacent conductive or semiconductive surfaces by virtue of recessing the surface into cavity 58. That is, overall capacitive area does not change since cavity 58 does not extend completely through the floating gate. Instead, the cavity relocates part of the capacitive area to an increased distance between adjacent gate material 56 surfaces. Adjacent surfaces still "see" the same capacitive area, but the distance between a portion of the surfaces increases. Geometries other than that shown in FIG. 12 are conceivable for a cavity that does not extend completely through a floating gate.

Since distance between floating gates represents one of the two primary factors determining the extent of capacitive coupling, such a configuration may reduce capacitive coupling, through not to the extent achievable by forming the cavity completely through the floating gate and filling with a dielectric. Correspondingly, formation of semiconductor or conductor material in cavity 38 may lessen the extent of reduction in capacitive coupling otherwise achievable if cavity 38 contains a dielectric. Considerations for filling cavity 58 with dielectric are similar to those discussed herein regarding filling cavity 38.

Figure 8:
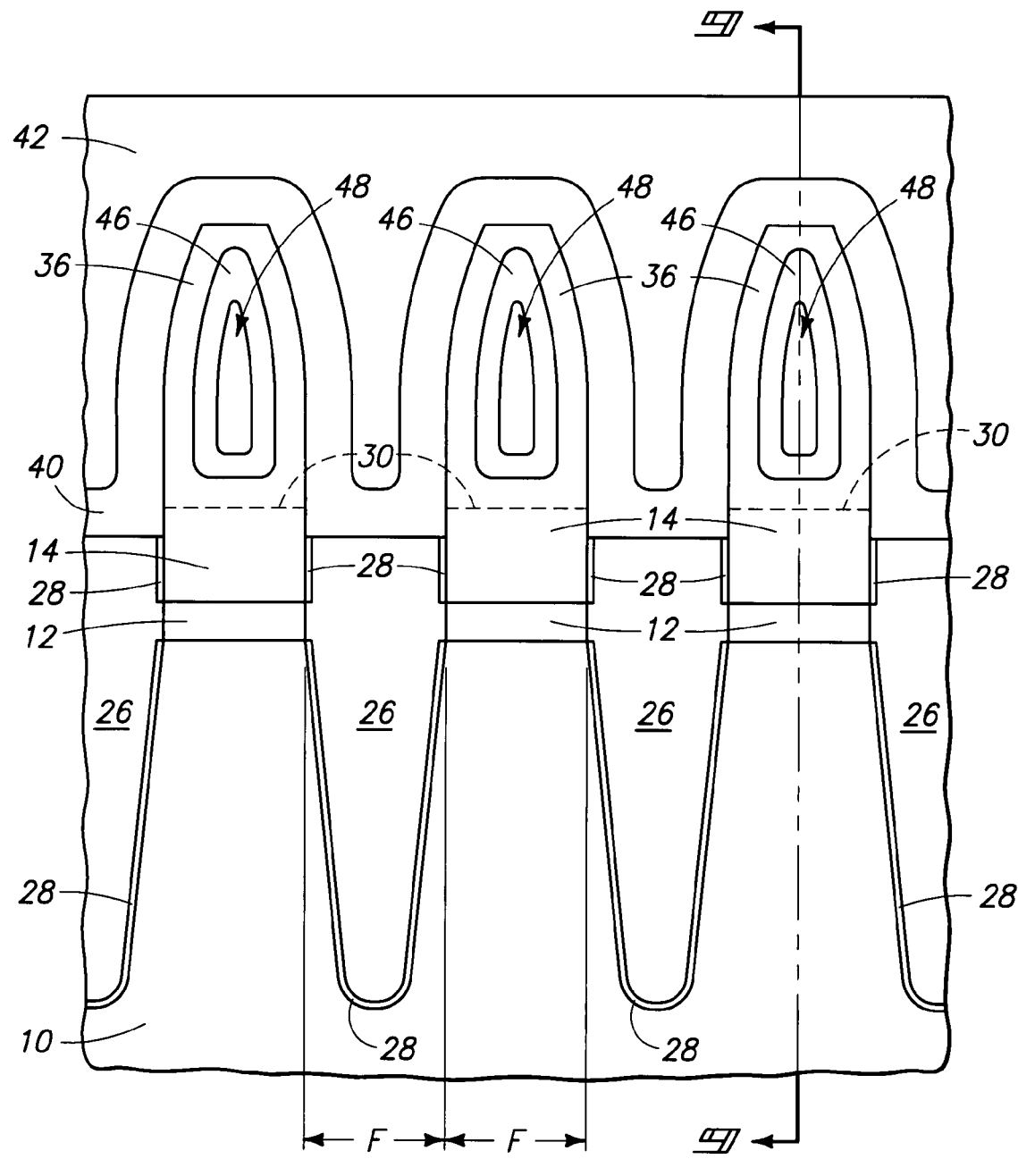
Figure 9:
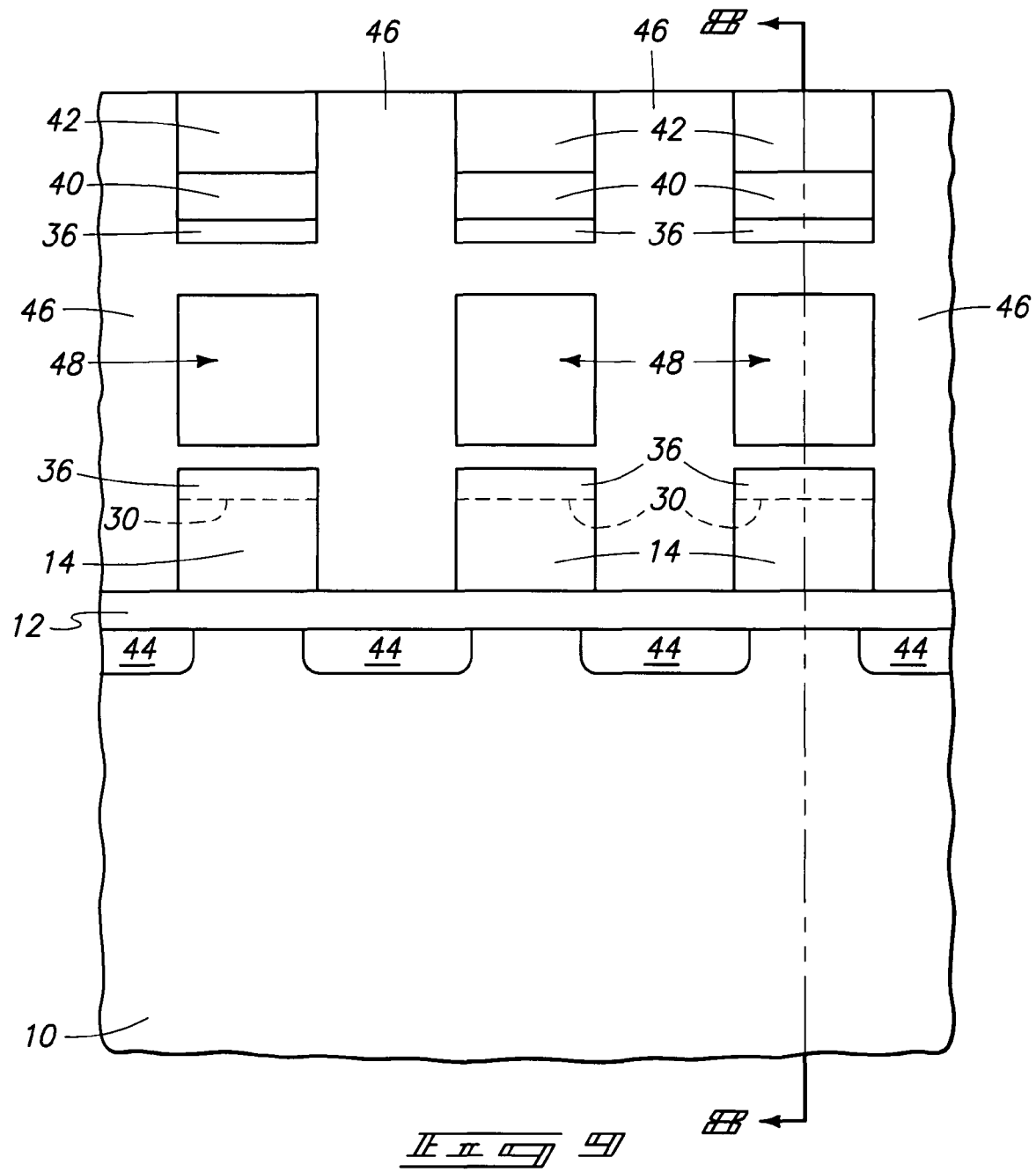

As indicated previously, a vacuum or gas-containing void in cavity 38 or 58 is expected to perform similarly to solid dielectric material in reducing capacitive coupling. FIGS. 8 and 9 show one embodiment that includes a solid dielectric material 46 and a gas in cavity 38. In the scenario shown in FIGS. 8 and 9, dielectric material 46 fills spaces 54 and also deposits conformally on the interior surface of gate material 36 formed by cavity 38. Dielectric material 46 might completely fill cavity 38 (not shown) or only partially fill cavity 38, leaving behind gas 48 as the remaining dielectric. Either configuration may produce a reduction in capacitive coupling.

Figure 10:
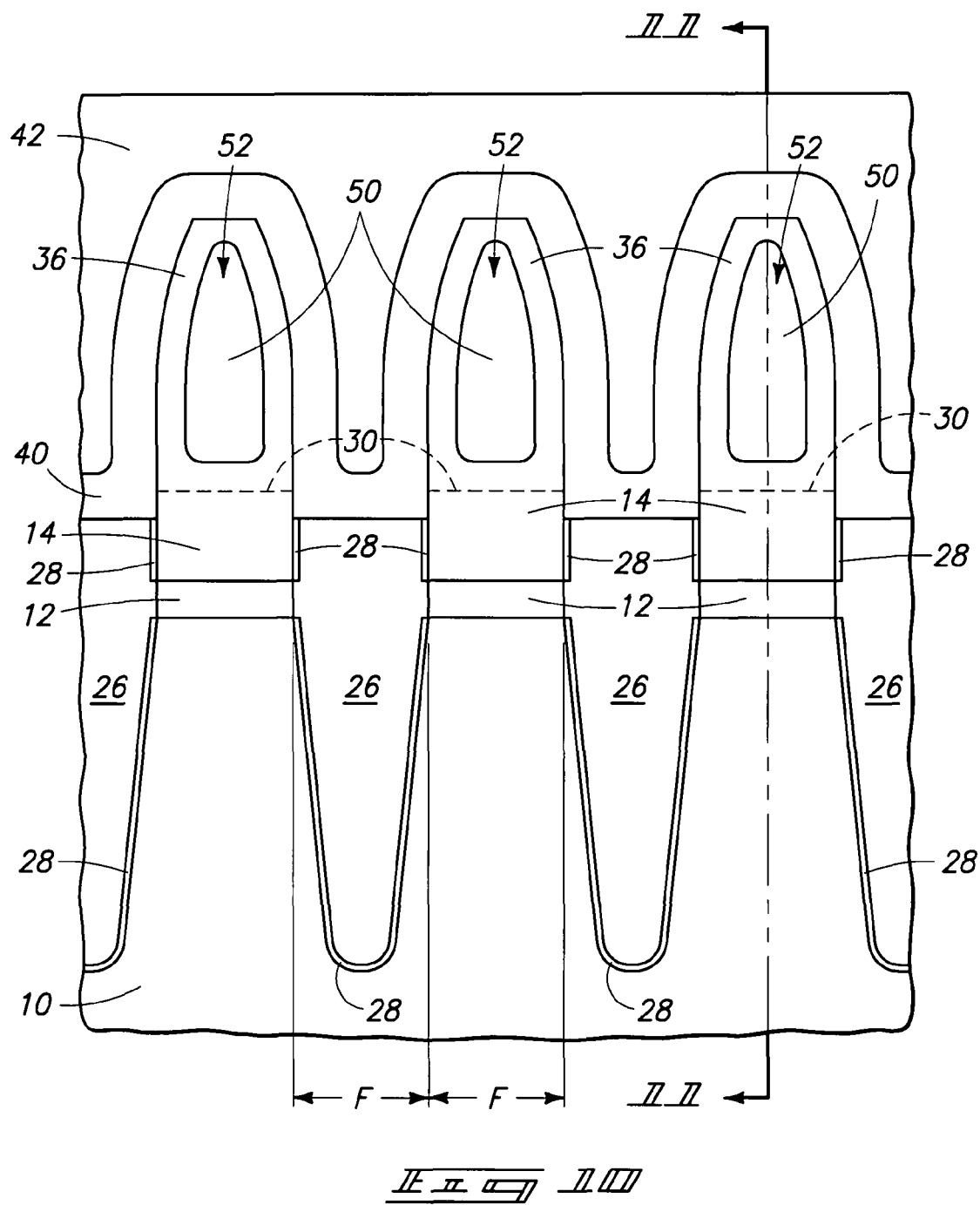
FIGS. 10 and 11 illustrate cross-sectional views of a portion of a memory array at an alternative stage of fabrication in comparison to that shown in FIGS. 8 and 9.
Figure 11:
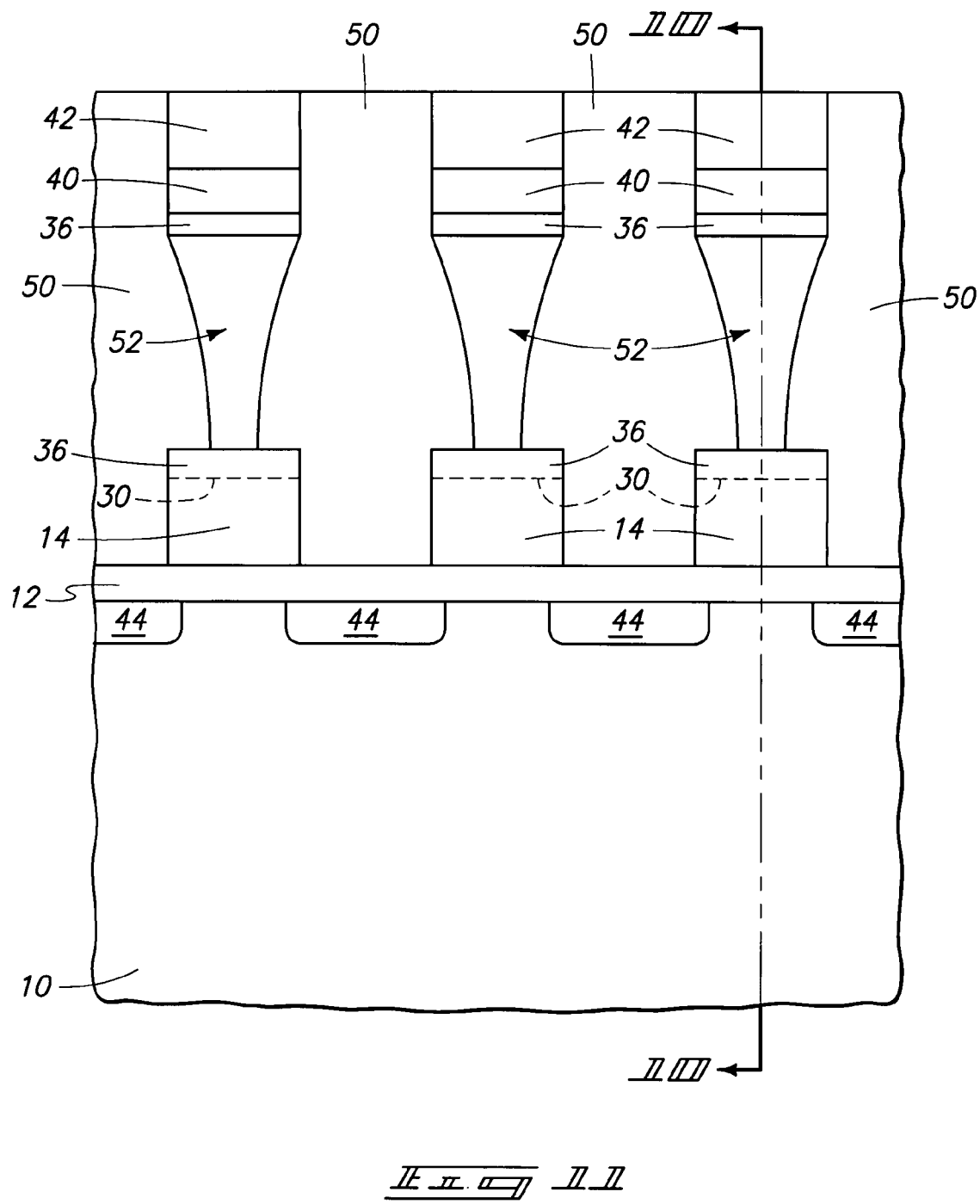

FIGS. 10 and 11 show another solid dielectric material 50 formed in spaces 54 and also partially filling cavity 38 to leave behind a gas 52, but in a configuration different from that shown in FIGS. 8 and 9. Specifically, dielectric material 50 does not deposit conformally on the interior surfaces of gate material 36 formed by cavity 38. Instead, dielectric material 50 forms primarily on the lower horizontal interior surface of gate material 36 within cavity 38 as dielectric material 50 begins to fill spaces 54. The configuration shown in FIGS. 10 and 11 for dielectric material 50 may result from a process that does not readily deposit dielectric material 50 on the vertical and upper horizontal interior surfaces of gate material 36 within cavity 38. Such a configuration may result from a "bottom-up" type of deposition process.

Regardless of the extent with which a cavity extends into a floating gate and the extent to which a cavity in a floating gate is filled with solid dielectric material, a variety of embodiments may be appreciated from the discussion herein providing a reduction in capacitive coupling of floating gates. Even so, some embodiments provide more reduction in capacitive coupling in accordance with the principles described herein.

Figure 13:
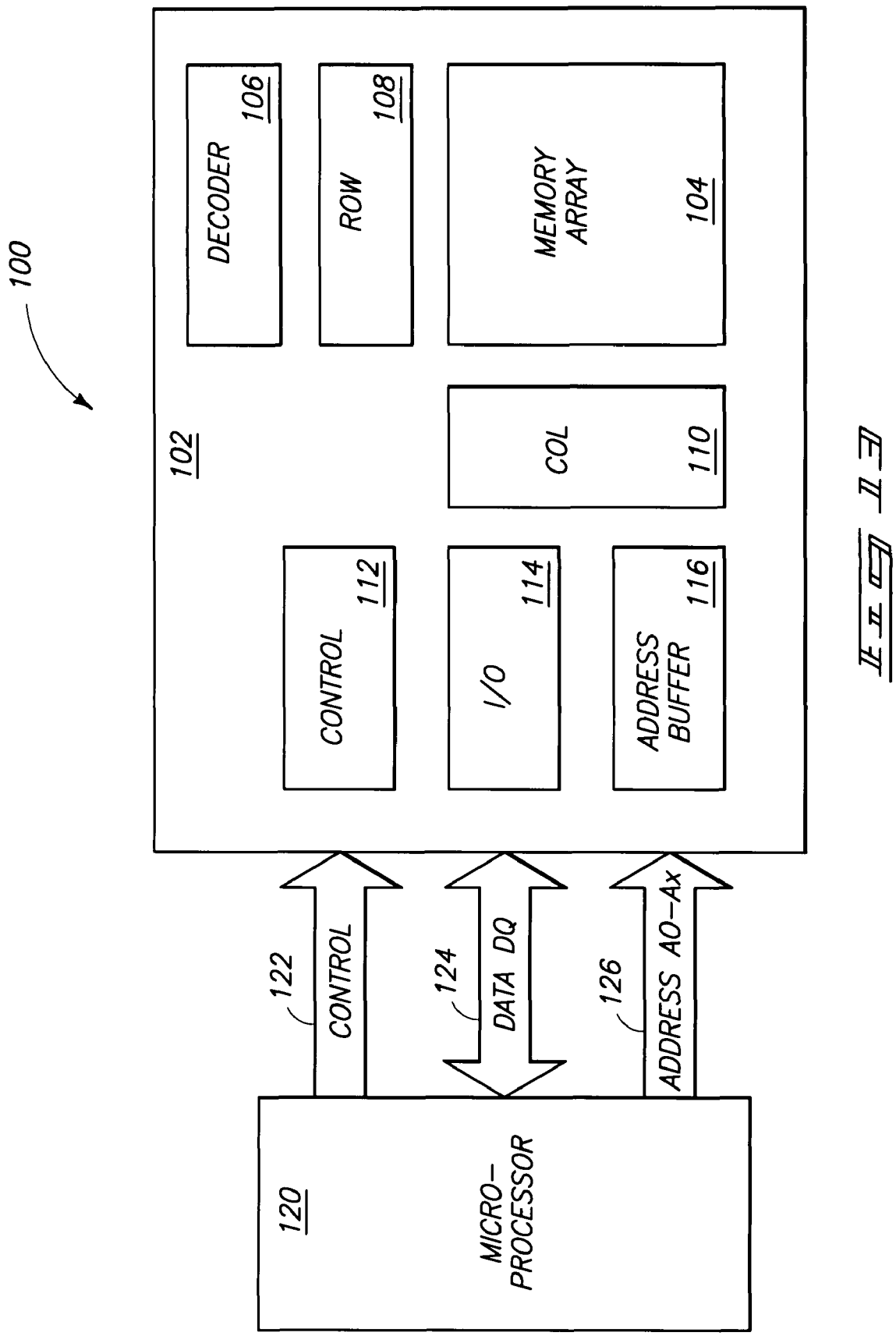
FIG. 13 is a simplified block diagram of a memory system.

FIG. 13 is a simplified block diagram of a memory system 100, according to one embodiment. Memory system 100 includes an integrated circuit flash memory device 102 (e.g., a NAND memory device), that includes an array of floating-gate memory cells 104, an address decoder 106, row access circuitry 108, column access circuitry 110, control circuitry 112, input/output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126, and are decoded at address decoder 106 to access the memory array 104. Address buffer circuit 116 latches the address signals. The memory cells may be accessed in response to the control signals and the address signals.

FIG. 14 is a schematic of a NAND memory array 200. Such may be a portion of memory array 104 of FIG. 13. Memory array 200 includes word lines $202_1$ to $202_N$, and intersecting local bit lines $204_1$ to $204_M$. The number of word lines 202 and the number of bit lines 204 may be each some power of two, for example, 256 word lines and 4,096 bit lines. The local bit lines 204 may be coupled to global bit lines (not shown) in a many-to-one relationship.

Memory array 200 includes NAND strings $206_1$ to $206_M$. Each NAND string includes floating gate transistors $208_1$ to $208_N$. The floating gate transistors are located at intersections of word lines 202 and local bit lines 204. The floating gate transistors 208 represent non-volatile memory cells for storage of data. The floating gate transistors 208 of each NAND string 206 are connected in series source-to-drain between a source select gate 210 and a drain select gate 212. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating gate transistor 208 of the corresponding NAND string 206. For example, the drain of source select gate $210_1$ is connected to the source of floating gate transistor $208_1$ of the corresponding NAND string $206_1$. A control gate 220 of each source select gate 210 is connected to source select line 214.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating gate transistor $208_N$ of the corresponding NAND string $206_1$.

Floating gate transistors 208 include a source 230 and a drain 232, a floating gate 234, and a control gate 236. Floating gate transistors 208 have their control gates 236 coupled to a word line 202. A column of the floating gate transistors 208 are those NAND strings 206 coupled to a given local bit line 204. A row of the floating gate transistors 208 are those transistors coupled to a given word line 202.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A transistor construction comprising:
   a first floating gate having a first conductive or semiconductive surface and a second floating gate having a second conductive or semiconductive surface; and
   a dielectric region circumferentially surrounded by the first surface, the region being configured to reduce capacitive coupling between the first and second surfaces compared to capacitive coupling with an otherwise identical first floating gate lacking the region.

2. The construction of claim 1 further comprising another dielectric region circumferentially surrounded by the second surface, the other region being configured to reduce the capacitive coupling compared to capacitive coupling with an otherwise identical second floating gate lacking the other region.

3. The construction of claim 1 wherein the region comprises silicon oxide, silicon nitride, a gas, or combinations thereof.

4. The construction of claim 1 wherein the region resides in a cavity extending into the first floating gate from the first surface.

5. The construction of claim 4 wherein the cavity extends completely through the first floating gate from the first surface to an opposing surface of the first floating gate.

6. The construction of claim 4 wherein the cavity extends only partly through a thickness of the first floating gate between the first surface and an opposing surface of the first floating gate.

7. The construction of claim 1 further comprising a bit line operationally associated with both the first floating gate and the second floating gate, the capacitive coupling being reduced in a direction along the bit line.

8. The construction of claim 1 further comprising an active area formed in a semiconductor material, a gate dielectric over the active area, the first floating gate over the gate dielectric, an intergate dielectric over the first floating gate, and a control gate over the intergate dielectric.

9. A transistor construction comprising a floating gate having a cavity extending completely through the floating gate from a first surface of the floating gate to an opposing second surface of the floating gate, but the floating gate otherwise enclosing the cavity, which is filled with at least one dielectric, wherein the first surface comprises a conductive surface and the transistor construction further comprises another floating gate having a third surface comprising a conductive surface, the cavity and the dielectric being configured to reduce capacitive coupling between the first and third surfaces compared to capacitive coupling with an otherwise identical floating gate lacking the cavity and the dielectric.

10. The construction of claim 9 further comprising a bit line associated with both the floating gate and the other floating gate, the capacitive coupling being reduced in a direction along the bit line between the first and third surfaces.

11. The construction of claim 9 wherein the dielectric comprises silicon oxide, silicon nitride, a gas, or combinations thereof.

12. The construction of claim 9 further comprising an active area formed in a semiconductor material, a gate dielectric over the active area, the floating gate over the gate dielectric, an intergate dielectric over the floating gate, and a control gate over the intergate dielectric.

13. The construction of claim 9 wherein the floating gate is comprised by a flash memory cell.

14. The construction of claim 13 wherein the floating gate is comprised by a NAND transistor of the flash memory cell.

15. The construction of claim 13 wherein the flash memory cell is one of a plurality of like memory cells in a cell array comprised by a memory device.

16. The construction of claim 15 wherein the memory device is comprised by an electronic system having a microprocessor.

17. A memory cell construction comprising:
   an active area formed in a semiconductor material, the active area including a source region and a drain region;
   a gate dielectric over the active area;
   a floating gate over the gate dielectric and operationally associated with the source and the drain region, the floating gate having a cavity extending completely through the floating gate from a first surface of the floating gate to an opposing second surface of the floating gate, but the floating gate otherwise enclosing the cavity;
   a dielectric filling the cavity, the cavity dielectric containing silicon oxide, silicon nitride, a gas, or combinations thereof;
   an intergate dielectric over the floating gate;
   a control gate over the intergate dielectric;
   a bit line associated with the floating gate and another floating gate, the cavity and the cavity dielectric being configured to reduce capacitive coupling in a direction along the bit line between the two floating gates compared to capacitive coupling with an otherwise identical floating gate lacking the cavity and the cavity dielectric.

18. The construction of claim 17 wherein floating gate comprises polysilicon.

19. The construction of claim 17 wherein the cavity dielectric consists essentially of silicon oxide.

20. The construction of claim 17 wherein the cavity dielectric consists essentially of silicon nitride.

21. The construction of claim 17 wherein the cavity dielectric consists essentially of a gas.

22. A NAND flash memory construction comprising:
   a first NAND transistor including a first floating gate having a first conductive or semiconductive surface and a second NAND transistor including a second floating gate having a second conductive or semiconductive surface, the first surface being adjacent to the second surface;

a first dielectric recessed into the first floating gate from a central region of the first surface, a second dielectric recessed into the second floating gate from a central region of the second surface, and the first dielectric and the second dielectric being configured to reduce capacitive coupling between the first and second surfaces compared to capacitive coupling between otherwise identical first and second floating gates lacking the first and second dielectrics.

23. The construction of claim 22 wherein the first dielectric and the second dielectric comprise silicon oxide, silicon nitride, a gas, or combinations thereof.

24. The construction of claim 22 wherein the first dielectric extends completely through the first floating gate from the first surface to an opposing surface of the first floating gate, but the first floating gate otherwise enclosing the first dielectric.

25. The construction of claim 22 wherein the first dielectric extends only partly through a thickness of the first floating gate between the first surface and an opposing surface of the first floating gate.

26. The construction of claim 22 further comprising a bit line operationally associated with both the first floating gate and the second floating gate, the capacitive coupling being reduced in a direction along the bit line.

* * * * *